(12) United States Patent
Chi et al.

(10) Patent No.: US 10,263,099 B2
(45) Date of Patent: *Apr. 16, 2019

(54) SELF-ALIGNED FINFET FORMATION

(71) Applicants: INTERNATIONAL BUSINESS MACHINES CORPORATION, Armonk, NY (US); GLOBALFOUNDRIES, Inc., Grand Cayman (KY)

(72) Inventors: Cheng Chi, Jersey City, NJ (US); Fee Li Lie, Albany, NY (US); Chi-Chun Liu, Altamont, NY (US); Ruilong Xie, Schenectady, NY (US)

(73) Assignees: INTERNATIONAL BUSINESS MACHINES CORPORATION, Armonk, NY (US); GLOBALFOUNDRIES.INC, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 15/876,606

(22) Filed: Jan. 22, 2018

(65) Prior Publication Data
US 2018/0158931 A1  Jun. 7, 2018

Related U.S. Application Data

(63) Continuation of application No. 15/178,871, filed on Jun. 10, 2016.

(51) Int. Cl.
*H01L 29/66* (2006.01)
*H01L 21/8234* (2006.01)
(Continued)

(52) U.S. Cl.
CPC .... *H01L 29/66795* (2013.01); *H01L 21/0332* (2013.01); *H01L 21/0337* (2013.01);
(Continued)

(58) Field of Classification Search
CPC ........... H01L 29/66795; H01L 29/0653; H01L 29/0847; H01L 29/16; H01L 29/1608;
(Continued)

(56) References Cited

U.S. PATENT DOCUMENTS 8,373,217 B2    2/2013  Chang
8,569,152 B1 * 10/2013  Basker .............. H01L 29/66795
                                                257/328
(Continued)

OTHER PUBLICATIONS

List of IBM Patents or Patent Applications Treated as Related; (Appendix P), Filed Jan. 22, 2018; pp. 1-2.
(Continued)

*Primary Examiner* — Sitaramarao S Yechuri
(74) *Attorney, Agent, or Firm* — Cantor Colburn LLP; Vazken Alexanian

(57) ABSTRACT

A method for fabricating a semiconductor device comprises forming a first hardmask, a planarizing layer, and a second hardmask on a substrate. Removing portions of the second hardmask and forming alternating blocks of a first material and a second material over the second hardmask. The blocks of the second material are removed to expose portions of the planarizing layer. Exposed portions of the planarizing layer and the first hardmask are removed to expose portions of the first hardmask. Portions of the first hardmask and portions of the substrate are removed to form a first fin and a second fin. Portions of the substrate are removed to further increase the height of the first fin and substantially remove the second fin. A gate stack is formed over a channel region of the first fin.

17 Claims, 23 Drawing Sheets

(51) Int. Cl.

| | | |
|---|---|---|
| *H01L 27/088* | (2006.01) | |
| *H01L 29/78* | (2006.01) | |
| *H01L 29/06* | (2006.01) | |
| *H01L 21/033* | (2006.01) | |
| *H01L 21/3105* | (2006.01) | |
| *H01L 21/3065* | (2006.01) | |
| *H01L 21/308* | (2006.01) | |
| *H01L 29/08* | (2006.01) | |
| *H01L 29/16* | (2006.01) | |
| *H01L 29/161* | (2006.01) | |
| *H01L 29/22* | (2006.01) | |
| *H01L 29/49* | (2006.01) | |
| *H01L 29/51* | (2006.01) | |

(52) U.S. Cl.
CPC ...... *H01L 21/3065* (2013.01); *H01L 21/3081* (2013.01); *H01L 21/3085* (2013.01); *H01L 21/3086* (2013.01); *H01L 21/31051* (2013.01); *H01L 21/823431* (2013.01); *H01L 27/0886* (2013.01); *H01L 29/0649* (2013.01); *H01L 29/0653* (2013.01); *H01L 29/0847* (2013.01); *H01L 29/16* (2013.01); *H01L 29/161* (2013.01); *H01L 29/1608* (2013.01); *H01L 29/22* (2013.01); *H01L 29/4966* (2013.01); *H01L 29/4983* (2013.01); *H01L 29/517* (2013.01); *H01L 29/66545* (2013.01); *H01L 29/7851* (2013.01); *H01L 29/7853* (2013.01)

(58) Field of Classification Search
CPC ... H01L 29/161; H01L 29/22; H01L 29/4966; H01L 29/4983; H01L 29/517; H01L 29/66545; H01L 29/7853; H01L 21/3065; H01L 21/3081; H01L 21/3085; H01L 21/3086
See application file for complete search history.

(56) References Cited

U.S. PATENT DOCUMENTS

| | | | | |
|---|---|---|---|---|
| 8,617,996 | B1 * | 12/2013 | Chi | H01L 21/30604 257/E21.377 |
| 8,637,359 | B2 * | 1/2014 | Chang | H01L 29/66545 257/347 |
| 8,859,433 | B2 * | 10/2014 | Abdallah | H01L 21/0337 257/E21.024 |
| 9,184,169 | B2 * | 11/2015 | Kim | H01L 27/1104 |
| 9,230,820 | B2 * | 1/2016 | Ruiz | H01L 21/3086 |
| 9,455,325 | B2 | 9/2016 | Wann et al. | |
| 9,812,336 | B2 | 11/2017 | Ganz et al. | |
| 2010/0167214 | A1 * | 7/2010 | Yoon | B81C 1/00031 430/323 |
| 2012/0306026 | A1 * | 12/2012 | Guo | H01L 29/495 257/407 |
| 2013/0273330 | A1 * | 10/2013 | Wang | B81C 1/0038 428/172 |
| 2013/0302975 | A1 * | 11/2013 | Chang | H01L 29/06 438/585 |
| 2014/0072830 | A1 * | 3/2014 | Lille | G11B 5/855 428/847 |
| 2014/0225065 | A1 * | 8/2014 | Rachmady | H01L 29/42392 257/24 |
| 2014/0264575 | A1 * | 9/2014 | Tsai | H01L 29/66492 257/336 |
| 2016/0068430 | A1 * | 3/2016 | Suenaga | C03C 15/00 216/41 |
| 2016/0077436 | A1 * | 3/2016 | Sakurai | C03C 17/36 428/201 |
| 2016/0181360 | A1 * | 6/2016 | Wang | H01L 29/66795 257/401 |
| 2016/0308058 | A1 * | 10/2016 | Cheng | H01L 29/7853 |
| 2016/0380052 | A1 * | 12/2016 | Kim | H01L 29/0653 257/401 |
| 2017/0358662 | A1 | 12/2017 | Chi et al. | |
| 2017/0358666 | A1 | 12/2017 | Chi et al. | |

OTHER PUBLICATIONS

Cheng Chi, "Self-Aligned Finfet Formation," Related Application; U.S. Appl. No. 16/056,934, filed Aug. 7, 2018.

List of IBM Patents or Patent Applications Treated As Related; (Appendix P), Filed Aug. 7, 2018; pp. 1-2.

* cited by examiner

SELF-ALIGNED FINFET FORMATION

DOMESTIC PRIORITY

This application is a continuation of U.S. Non-Provisional application Ser. No. 15/178,871, entitled "SELF-ALIGNED FINFET FORMATION", filed Jun. 10, 2016, which is incorporated herein by reference in its entirety.

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for fabricating a semiconductor device comprises forming a first hardmask on a semiconductor substrate, a planarizing layer on the first hardmask, and a second hardmask on the planarizing layer. Portions of the second hardmask are removed. Alternating blocks of a first material and a second material are formed over the second hardmask. The blocks of the second material are removed to expose portions of the planarizing layer. Exposed portions of the planarizing layer are removed to expose portions of the first hardmask, and portions of the first hardmask are removed to expose portions of the semiconductor substrate. Exposed portions of the semiconductor substrate are removed to form a first fin and a second fin, where the first fin is arranged under a portion of the planarizing layer. Exposed portions of the semiconductor substrate are removed to further increase the height of the first fin and substantially remove the second fin. A gate stack is formed over a channel region of the first fin.

According to another embodiment of the present invention, a method for fabricating a semiconductor device comprises forming a first hardmask on a semiconductor substrate, a planarizing layer on the first hardmask, and a second hardmask on the planarizing layer. The second hardmask includes a first layer arranged on the planarizing layer, a second layer arranged on the first layer, and a third layer arranged on the second layer. Portions of the third layer and the second layer are removed to expose portions of the first layer of the second hardmask. Alternating blocks of a first material and a second material are formed over exposed portions of the first layer of the second hardmask and the third layer of the second hardmask. The blocks of the second material are removed to expose portions of the planarizing layer. Exposed portions of the planarizing layer are removed to expose portions of the first hardmask and portions of the first hardmask are removed to expose portions of the semiconductor substrate. Exposed portions of the semiconductor substrate are removed to form a first fin and a second fin, where the first fin is arranged under a portion of the planarizing layer. Exposed portions of the semiconductor substrate are removed to increase a height of the first fin and the second fin. Portions of the first hardmask are removed from above the second fin. Exposed portions of the semiconductor substrate are removed to further increase the height of the first fin and substantially remove the second fin. A gate stack is formed over a channel region of the first fin.

According to yet another embodiment of the present invention, a semiconductor device comprises a semiconductor fin arranged on a substrate, the semiconductor fin having a sloped profile on a first sidewall of the semiconductor fin and a substantially planar profile on a second sidewall of the semiconductor fin. An insulator layer is arranged on the substrate adjacent to the semiconductor fin, and a gate stack is arranged over a channel region of the semiconductor fin.

DETAILED DESCRIPTION

As the scale of semiconductor devices continues to be reduced, the new challenges for fabricating smaller semiconductor devices emerge. Directed self-assembly (DSA) is a fabrication approach that uses self-assembly properties of materials for form semiconductor devices.

One of the challenges in forming finFET devices is forming the fins on a substrate. Often the fins are formed across an entire substrate, which facilitates forming uniform fins having desired dimensions. Following the formation of the fins, some fins are removed or "cut" to achieve a desired fin arrangement. In previous methods, the fins were cut using a lithographic mask. However, aligning the mask properly provides challenges, and the tight arrangement of fins may result in undesired damage to the remaining fins following the fin cut.

The methods and resultant structures described herein provide for a method for forming fins of a finFET device using directed self-assembly concepts.

Figure 1:
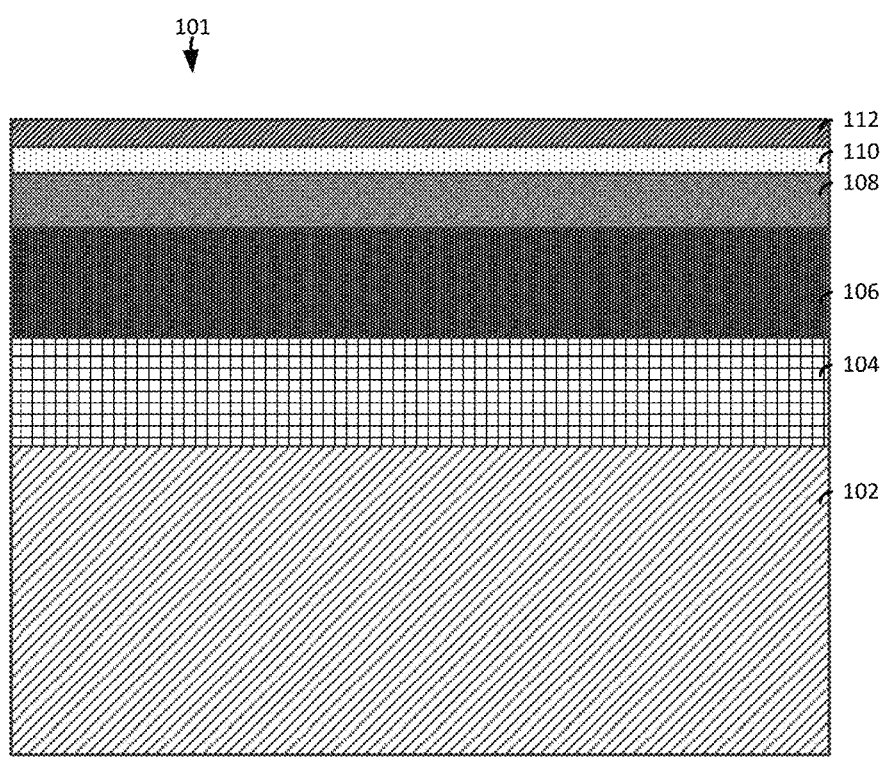
FIG. 1 illustrates a side view of a bulk semiconductor substrate.

FIG. 1 illustrates a side view of a bulk semiconductor substrate (substrate) 102. The substrate 102. The substrate 102 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 102 may also comprise an organic semiconductor or a layered semiconductor such as, for example, Si/SiGe, a silicon-on-insulator or a SiGe-on-insulator. A portion or entire semiconductor substrate 102 may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate 102 may be doped, undoped or contain doped regions and undoped regions therein. The semiconductor substrate may contain regions with strain and regions without strain therein, or contain regions of tensile strain and compressive strain.

A first hardmask 104 is arranged on the semiconductor substrate 102. The first hardmask 104 may include, for example, silicon oxide, silicon nitride (SiN), SiOCN, SiBCN or any suitable combination of those. The first hardmask 104 may be deposited using a deposition process, including, but not limited to, PVD, CVD, PECVD, or any combination thereof.

An organic planarizing layer 106 is arranged on the first hardmask 104. The organic planarizing layer 106 includes, for example, a carbon-based spin-on material.

A second hardmask 101 is formed on the organic planarizing layer 106. The second hardmask 101 in the illustrated embodiment includes three layers. The first layer 108 includes a hardmask material such as, for example, a nitride material that is deposited on the organic planarization layer 106. The second layer 110 includes another hardmask material such as, for example, an oxide material that is deposited on the first layer 108. The third layer 112 includes, for example, a polymer material that is deposited on the second layer 110. The first layer 108 is relatively thicker than the second layer 110 or the third layer 112. The first layer 108 and the second layer 110 may include, for example, silicon oxide, silicon nitride, Ti oxide, Hf oxide, or any two materials that can be selectively etched over the other. The third layer 112 may include, for example, a random copolymer of methyl methacrylate and styrene where the styrene content could vary from 0% to 100%. Other monomers, such as vinylpyridine, hydroxylstyrene, lactic acid, carbonate, may be used to form the third layer 112.

Figure 2:
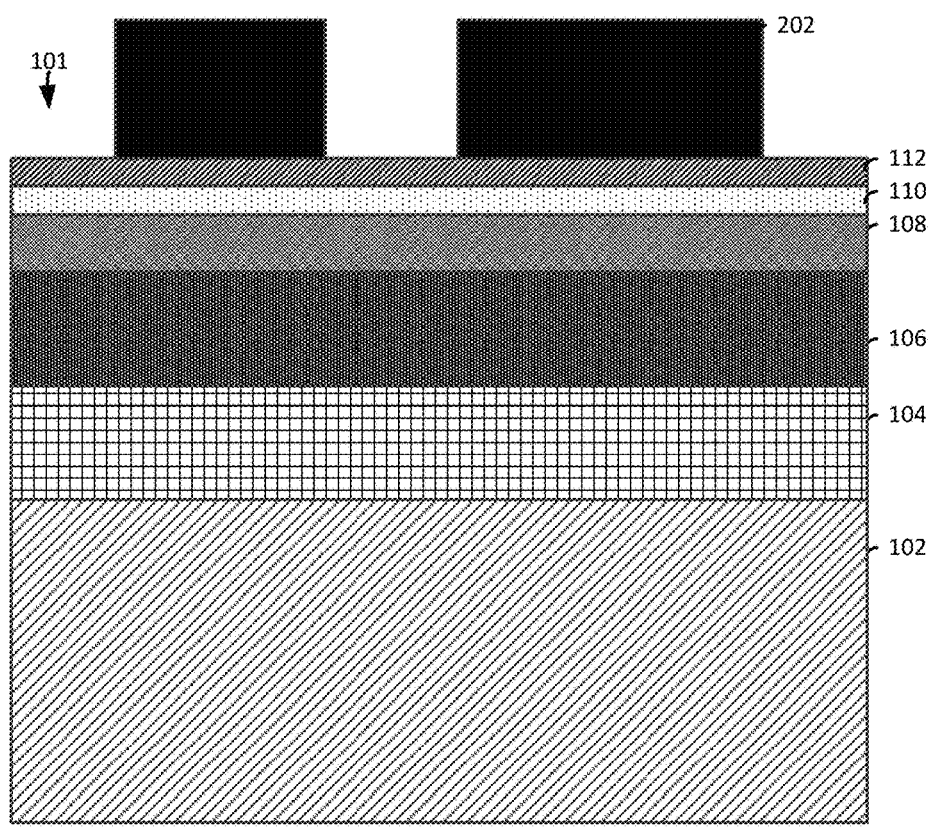
FIG. 2 illustrates a side view following the patterning of a photolithographic resist mask on the second hardmask.

FIG. 2 illustrates a side view following the patterning of a photolithographic resist mask 202 on the second hardmask 101. Suitable resist masks include photoresists, electronbeam resists, ion-beam resists, X-ray resists, and etch resists. The resist may a polymeric spin on material or a polymeric material.

Figure 3:
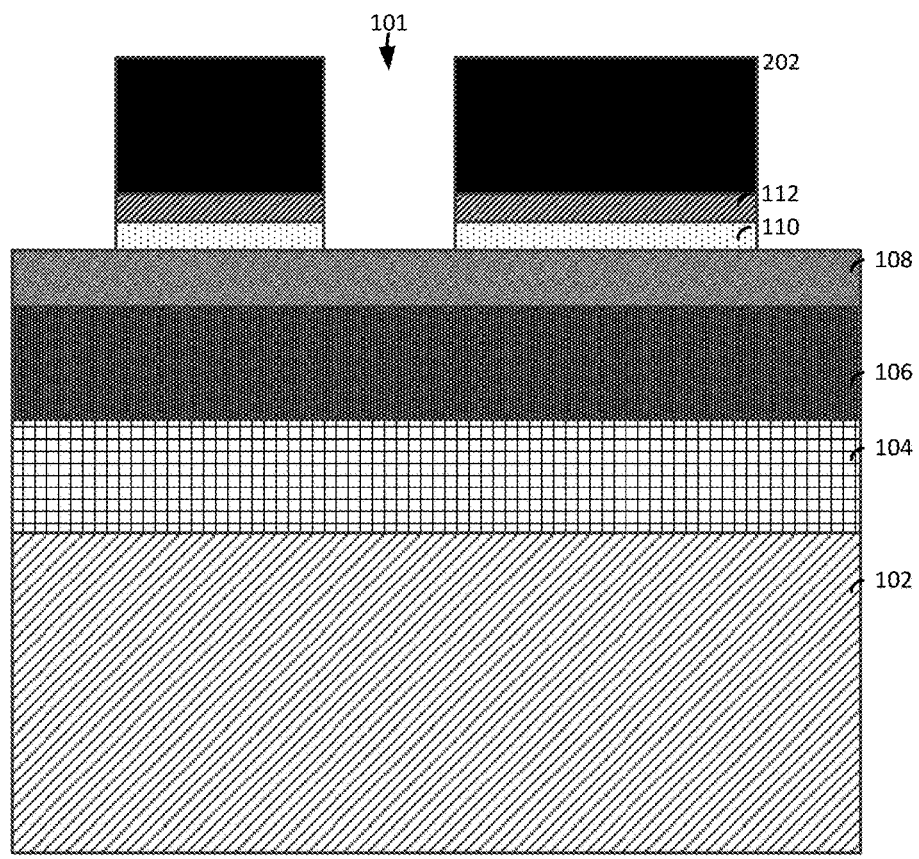
FIG. 3 illustrates a side view following a selective etching process that removes exposed portions of the third layer and the second layer of the second hardmask.

FIG. 3 illustrates a side view following a selective etching process that removes exposed portions of the third layer 112 and the second layer 110 of the second hardmask 101 to expose portions of the first layer 108 of the second hardmask 101. The etching process may include a suitable anisotropic etching process such as, for example, reactive ion etching.

Figure 4A:
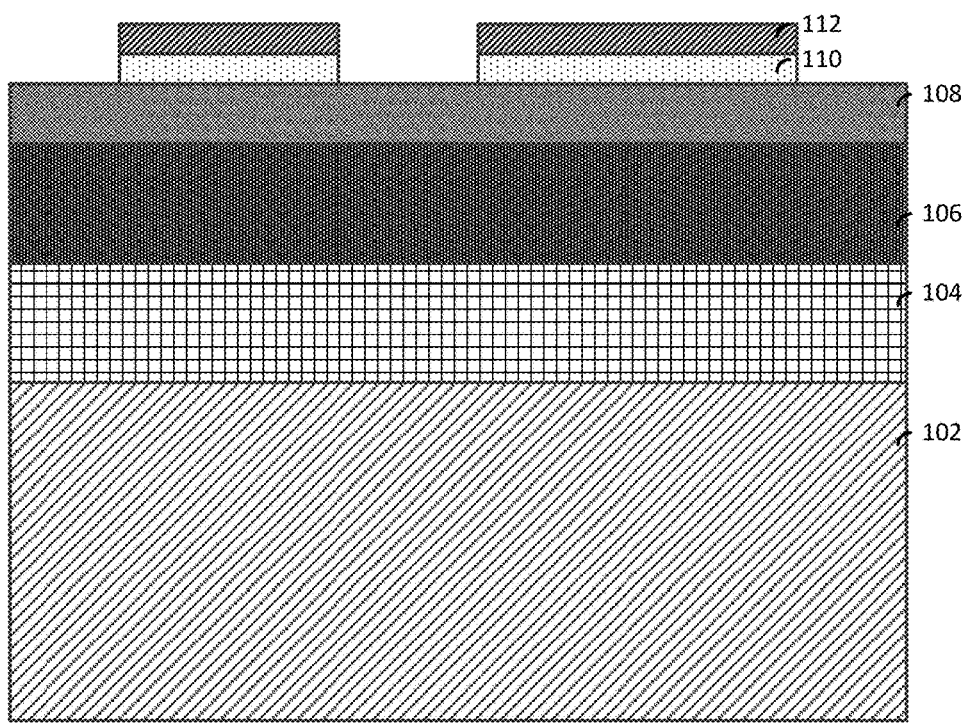
FIG. 4A illustrates a cut-away view along the line A-A (of FIG. 4B) of the resultant structure following the removal of the mask.

FIG. 4A illustrates a cut-away view along the line A-A (of FIG. 4B) of the resultant structure following the removal of the mask 202 (of FIG. 3) using a suitable process such as, for example, ashing. The ashing process may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 4B:
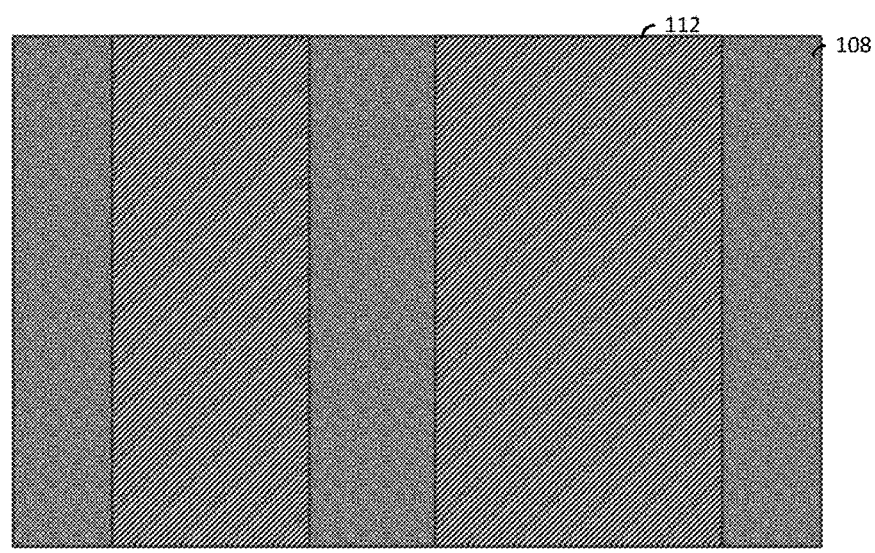
FIG. 4B illustrates a top view of the first layer of the second hardmask and the third layer of the second hardmask.

FIG. 4B illustrates a top view of the first layer 108 of the second hardmask 101 and the third layer 112 of the second hardmask 101.

Figure 5:
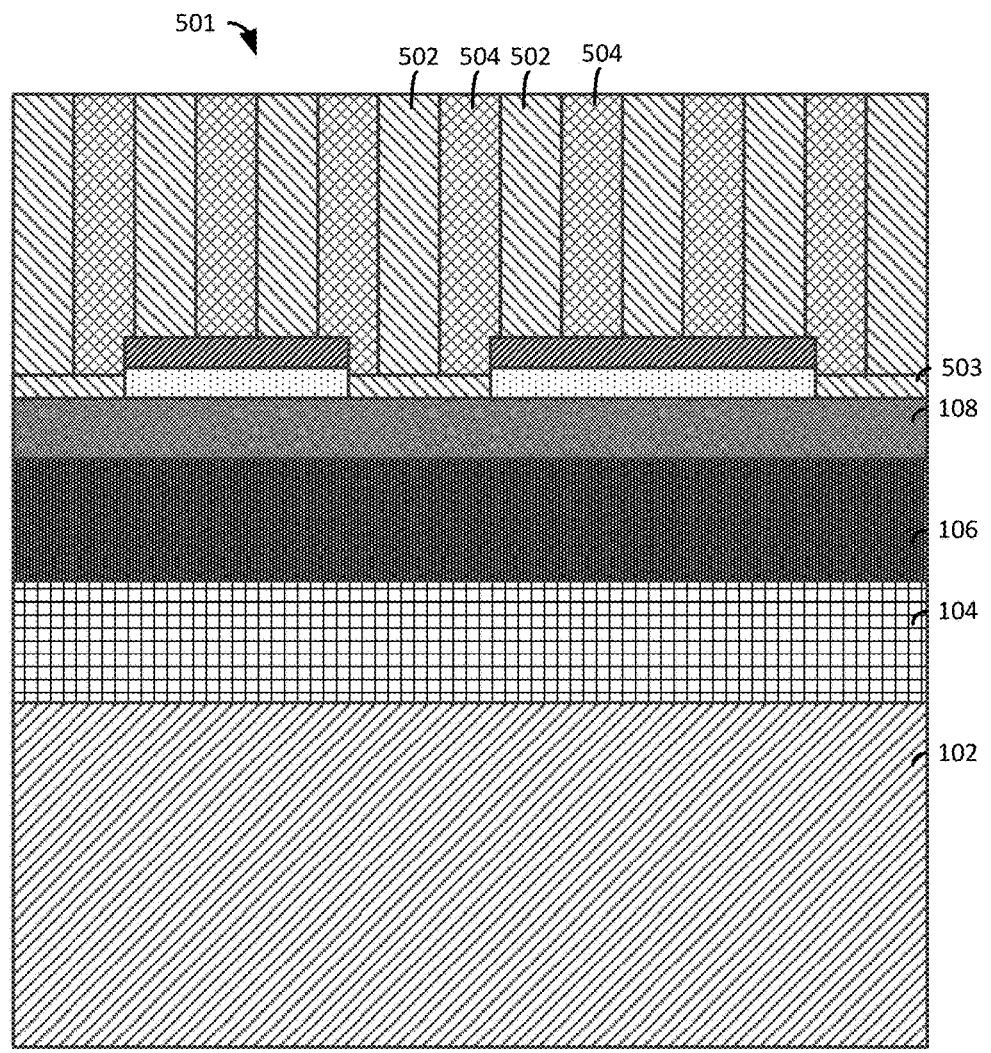
FIG. 5 illustrates a side view following the deposition of a backfill layer over exposed portions of the first layer of the second hardmask.

FIG. 5 illustrates a side view following the deposition of a backfill layer 503 over exposed portions of the first layer 108 of the second hardmask 101. Following the deposition of the backfill layer 103, a directed self-assembly method is used to deposit a block copolymer material. In the illustrated exemplary embodiment, a first material block 502 is arranged adjacent to a second material block 504 in an alternating arrangement. In the illustrated embodiment, the first material blocks 502 include, for example, an acrylic material such as Poly(methyl methacrylate) (PMMA). The second material blocks 504 include, for example, a polystyrene material. The backfill layer 103 in the illustrated embodiment is a similar material as the material that forms the first material blocks 501 (e.g., PMMA). Alternate block copolymer materials include, for example, PS-PVP (polystyrene-polyvinylpyridine), PS-PDMS (polystyrene-polydimethysiloxane) PS-PHOST (polystyrene-polyhydroxylstyrene), PS-PLA (polystyrene-polylactic acid), PS-PC (polystyrene-polycarbonate).

Figure 6A:
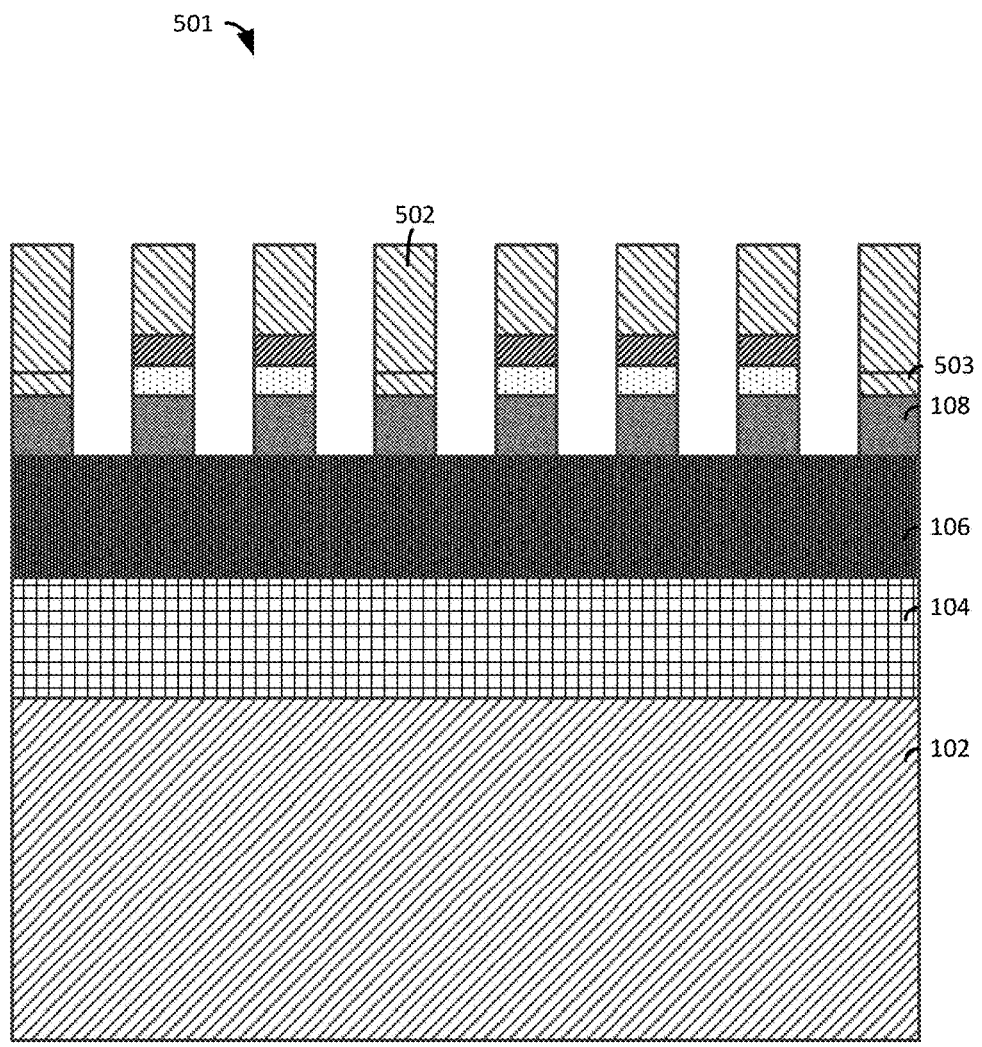
FIG. 6A illustrates a side view of the resultant structure following a selective etching process.
Figure 6B:
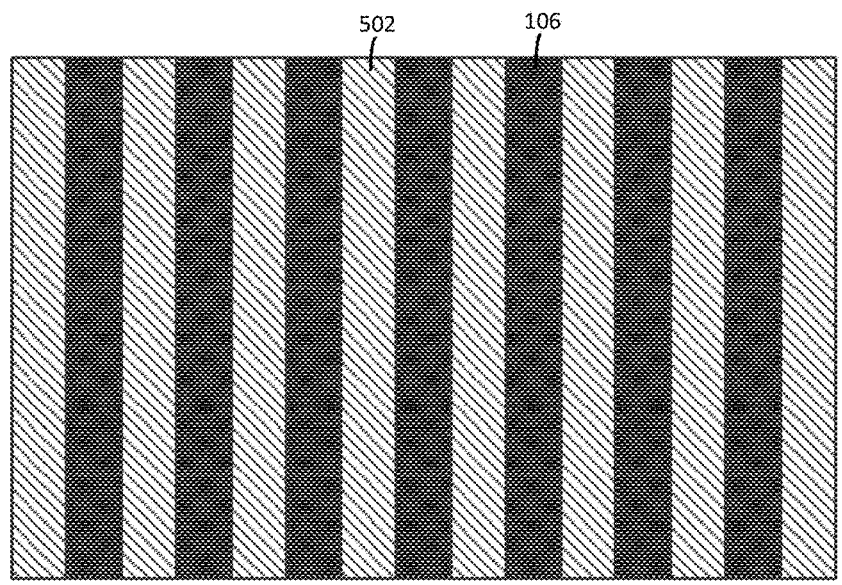
FIG. 6B illustrates a top view of the resultant structure following the selective etching process.

FIG. 6A illustrates a side view of the resultant structure following a selective etching process. The etching process removes exposed portions of the second material blocks 504 (of FIG. 5). The exposed backfill layer 503 arranged below the second material blocks 504 is also removed to expose portions of the underlying first hardmask 108. The exposed portions of the first hardmask 108 are removed to expose portions of the organic planarization layer 106. During the removal of the backfill layer 503, portions of the first material block 502 are removed, which reduces the height of the first material block 502. FIG. 6B illustrates a top view of the resultant structure following the selective etching process. The selective etching process may include, for example, an oxygen-based etch, such as Ar/O2, Ar/CO, Ar/CO2, Ar/H2, N2/H2.

Figure 7:
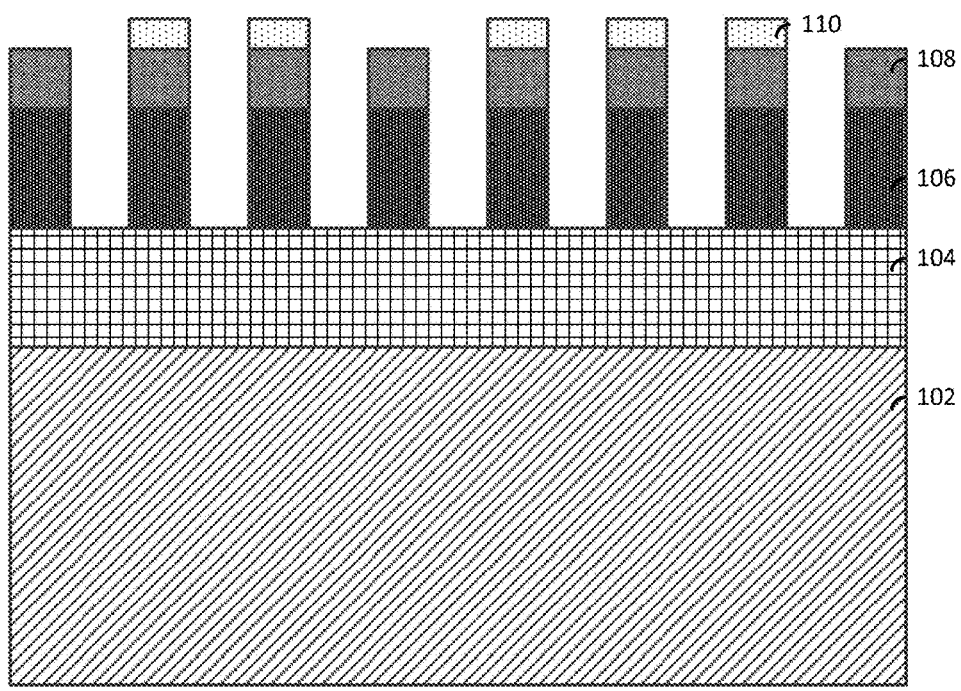
FIG. 7 illustrates a side view following another selective etching process that removes exposed portions of the organic planarization layer to expose portions of the first hardmask.

FIG. 7 illustrates a side view following another selective etching process that removes exposed portions of the organic planarization layer 106 to expose portions of the first hardmask 104. The etching process removes the first material blocks 502 (of FIG. 6A) and the exposed backfill layer 103 to expose portions of the first layer 108 of the second hardmask 101. The third layer 112 of the first hardmask 101 (of FIG. 6A) is also removed to expose portions of the second layer 110 of the first hardmask 101.

Figure 8:
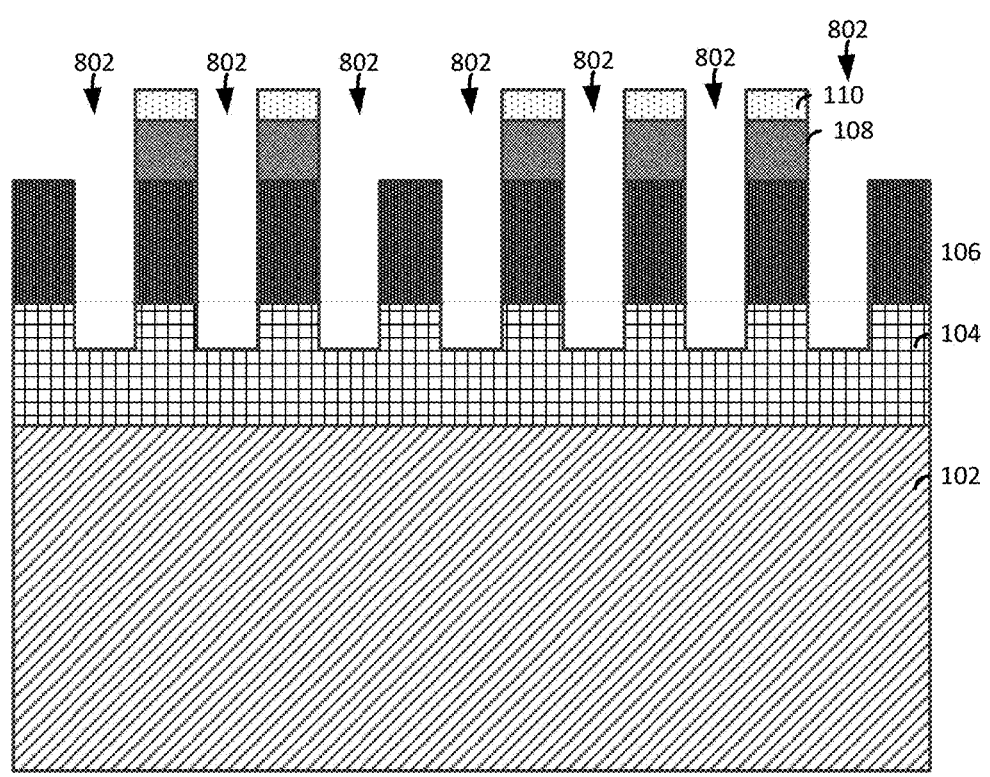
FIG. 8 illustrates a side view of another selective anisotropic etching process that removes exposed portions of the first layer of the second hardmask and portions of the first hardmask to form cavities.

FIG. 8 illustrates a side view of another selective anisotropic etching process that removes exposed portions of the first layer 108 of the second hardmask 101 and portions of the first hardmask 104 to form cavities 802 in the first hardmask 104.

Figure 9:
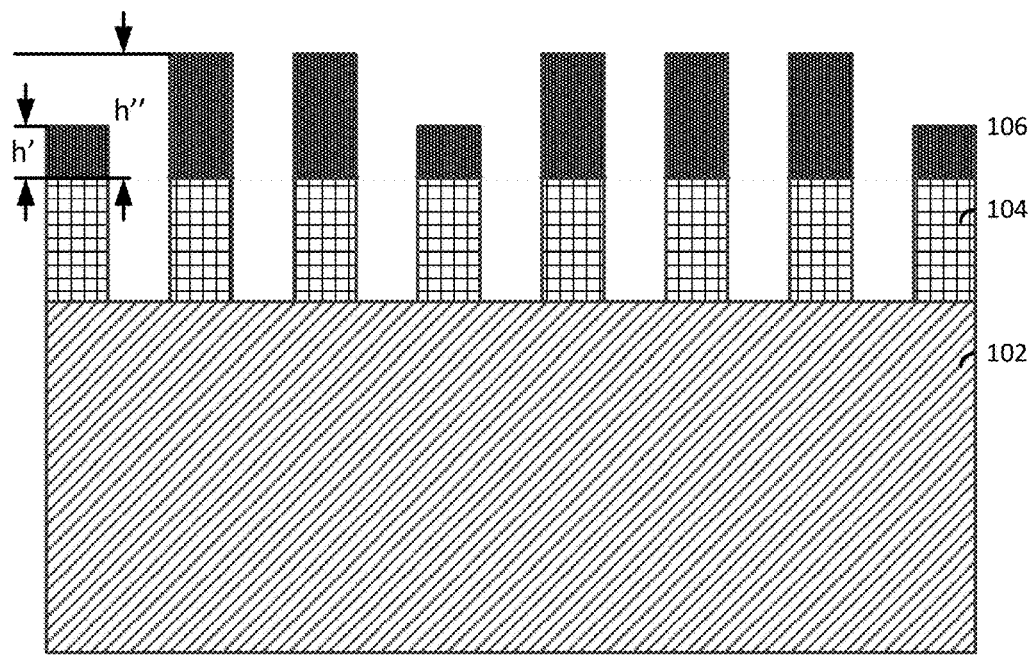
FIG. 9 illustrates a side view following a selective etching process that removes exposed portions of the second layer and the first layer and increases the depth of the cavities.

FIG. 9 illustrates a side view following a selective etching process that removes exposed portions of the second layer 110 and the first layer 108 and increases the depth of the cavities 802 and exposes portions of the substrate 102. During the etching process, exposed portions of the organic planarizing layer 106 are removed. In this regard, because the third material layer 110 and the first layer 108 were arranged on portions of the organic planarizing layer 106 (in FIG. 8), some portions of the organic planarizing layer 106 are etched earlier in the etching process and result in having a height h', where other portions of the organic planarizing layer 106 have a height h". The h" is greater than h'.

Figure 10A:
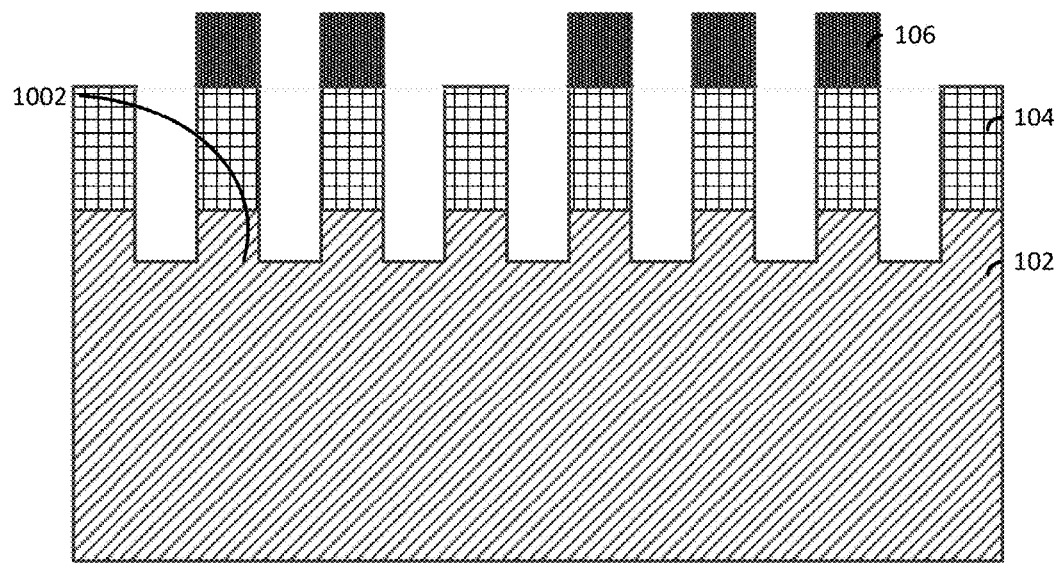
FIG. 10A illustrates a cut-away view along the line A-A (of FIG. 10B) following a selective anisotropic etching process.
Figure 10B:
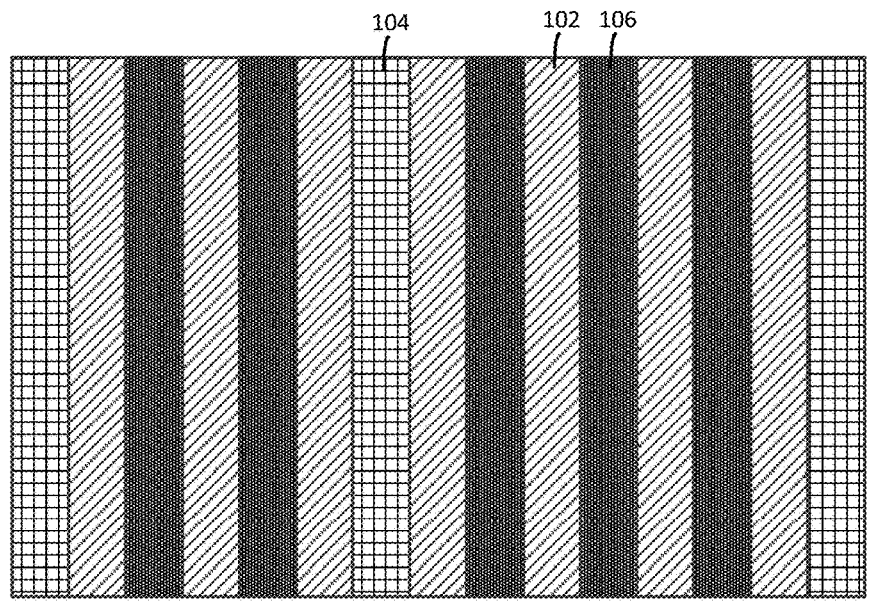
FIG. 10B illustrates a top view following the etching process.

FIG. 10A illustrates a cut-away view along the line A-A (of FIG. 10B) following a selective anisotropic etching process such as, for example, reactive ion etching. The etching process removes exposed portions of the substrate 102 to forms fins 1002. FIG. 10B illustrates a top view following the etching process.

Figure 11:
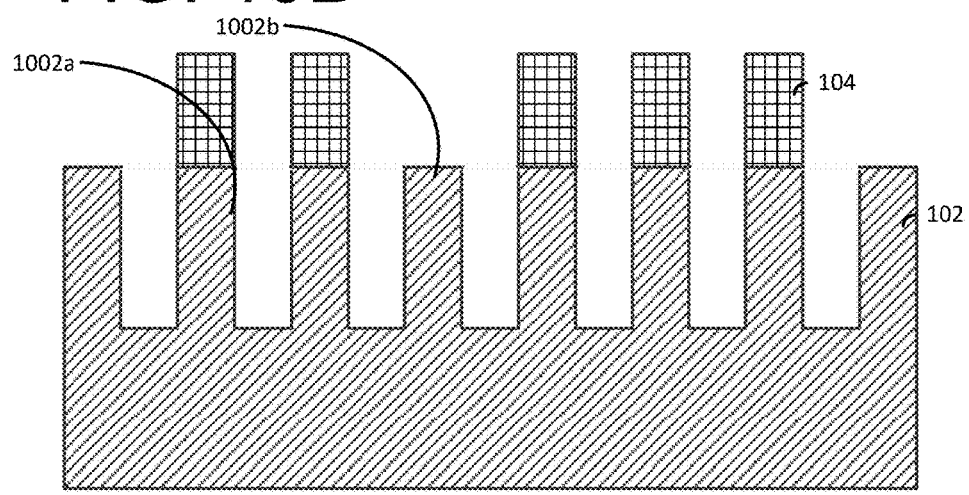
FIG. 11 illustrates a side view following a selective anisotropic etching process that increases further removes exposed portions of the substrate to increase the height of the fins.

FIG. 11 illustrates a side view following a selective anisotropic etching process that further removes exposed portions of the substrate 102 to increase the height of the fins 1002. The etching process removes exposed portions of the first hardmask 104 and the remaining portions of the organic planarization layer 106 (of FIG. 10A). The fins 1002a remain beneath the first hardmask 104 (which remains due to the organic planarization layer 106) while the fins 1002b become exposed when the first hardmask 104 is removed.

Figure 12A:
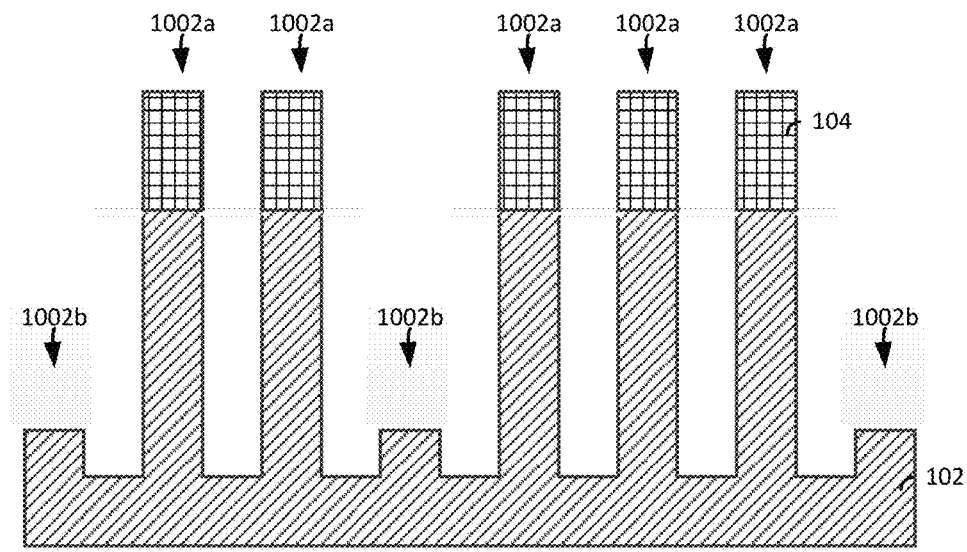
FIG. 12A illustrates a cut-away view along the line A-A (of FIG. 12B) following another selective anisotropic etching process.
Figure 12B:
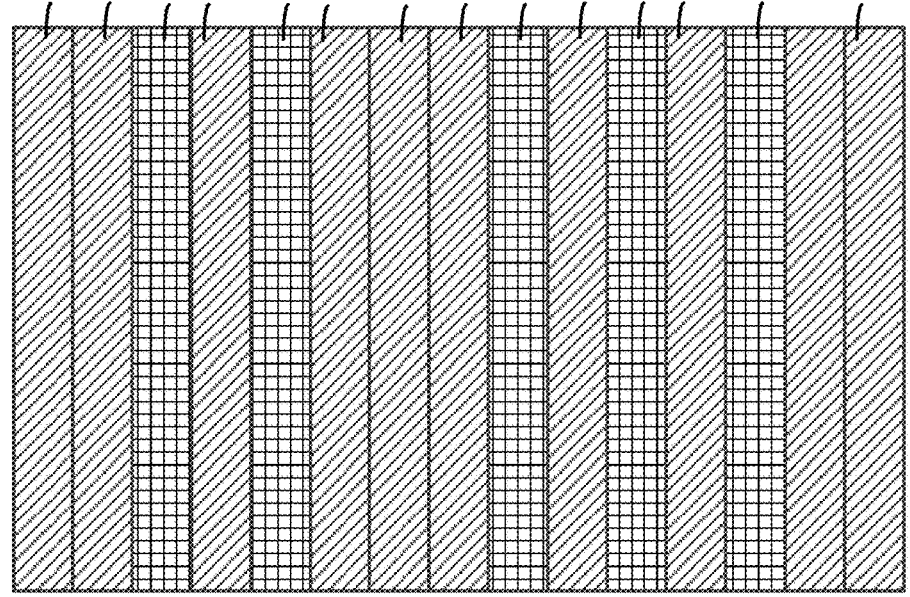
FIG. 12B illustrates a top view of the fins.

FIG. 12A illustrates a cut-away view along the line A-A (of FIG. 12B) following another selective anisotropic etching process such as, for example, reactive ion etching. That continues to remove exposed portions of the substrate 102. The etching process increases the height of the fins 1002a because the fins 102a remain below the first hardmask 104. The fins 1002b are substantially removed by the etching process. Regions of the fins 1002b may remain following the etching process. FIG. 12B illustrates a top view of the fins 1002b.

Figure 13:
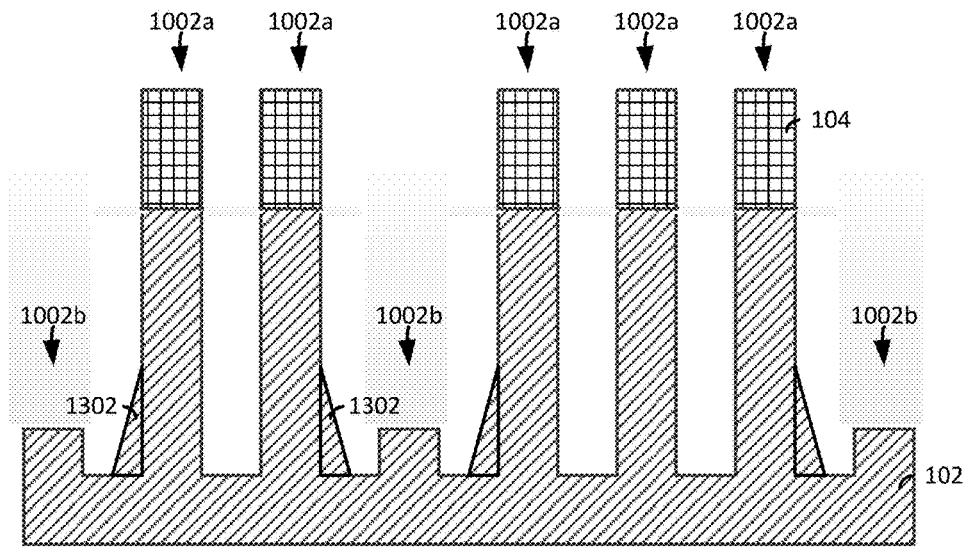
FIG. 13 illustrates a side view of an alternate exemplary embodiment following the formation of the fins.

FIG. 13 illustrates a side view of an alternate exemplary embodiment following the formation of the fins 1002a. In this regard, following the etching process and the removal of the fins 1002b sloped regions 1302 at the base of the fins 1002a may be formed adjacent to the fins 1002b. The sloped regions 1302 are formed due to a "micro loading effect" that forms a deeper and larger tapered structure in the open area as compared to the nested area.

Figure 14:
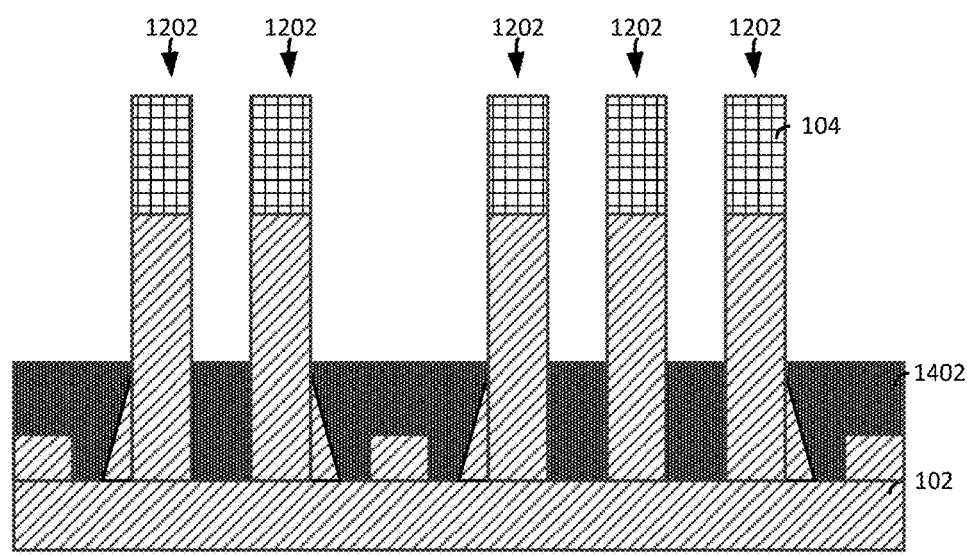
FIG. 14 illustrates a side view following the deposition of an insulating layer.

FIG. 14 illustrates a side view following the deposition of an insulating layer 1402 such as, for example, an oxide material.

Figure 15A:
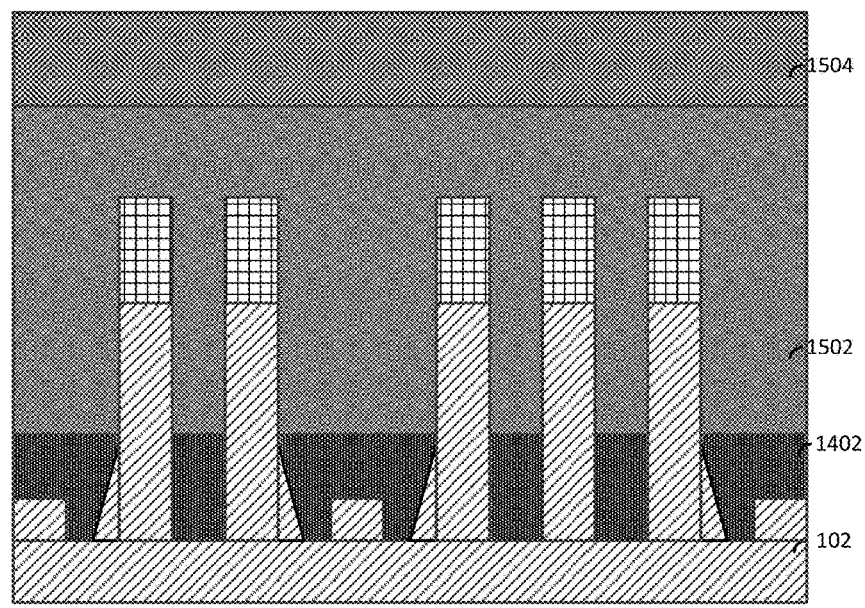
FIG. 15A illustrates a cut-away view along the line A-A (of FIG. 15B) following the formation of a sacrificial gate over channel regions of the fins.

FIG. 15A illustrates a cut-away view along the line A-A (of FIG. 15B) following the formation of a sacrificial gate 1502 over channel regions of the fins 1002a.

The sacrificial gates 1502 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 1502 may further comprises a sacrificial gate dielectric material such as silicon oxide between the nanowires and aSi or polysilicon material.

The layer of sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 1504. The hardmask layer may be deposited using a deposition process, including, but not limited to, PVD, CVD, PECVD, or any combination thereof.

Figure 15B:
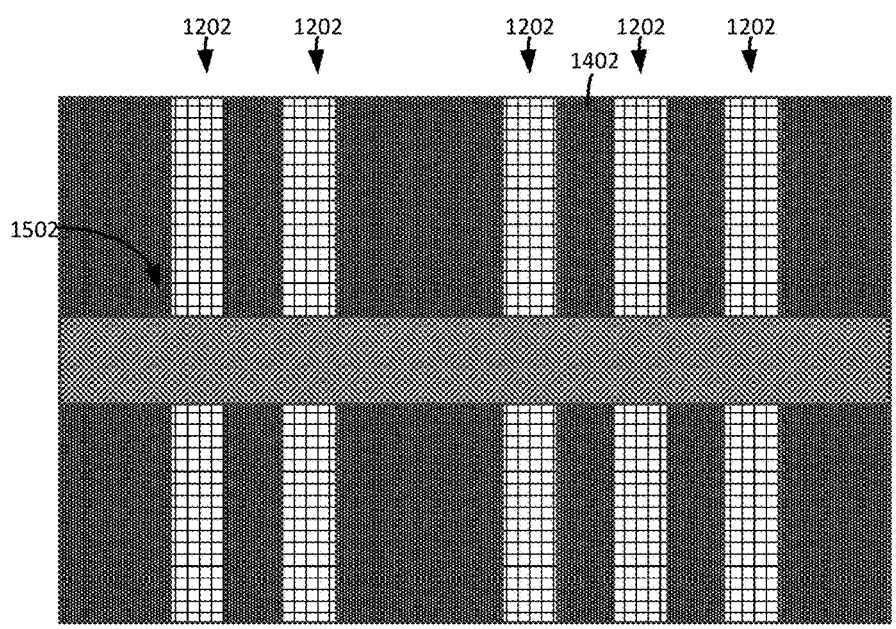
FIG. 15B illustrates a top view of the sacrificial gate.

Following the deposition of the layer of sacrificial gate material and the hardmask layer, a lithographic patterning and etching process such as, for example, reactive ion etching or a wet etching process is performed to remove exposed portions of the hardmask layer and the layer of sacrificial gate material to form the sacrificial gates 1502 and the sacrificial gate caps 1504. FIG. 15B illustrates a top view of the sacrificial gate 1502.

Figure 16:
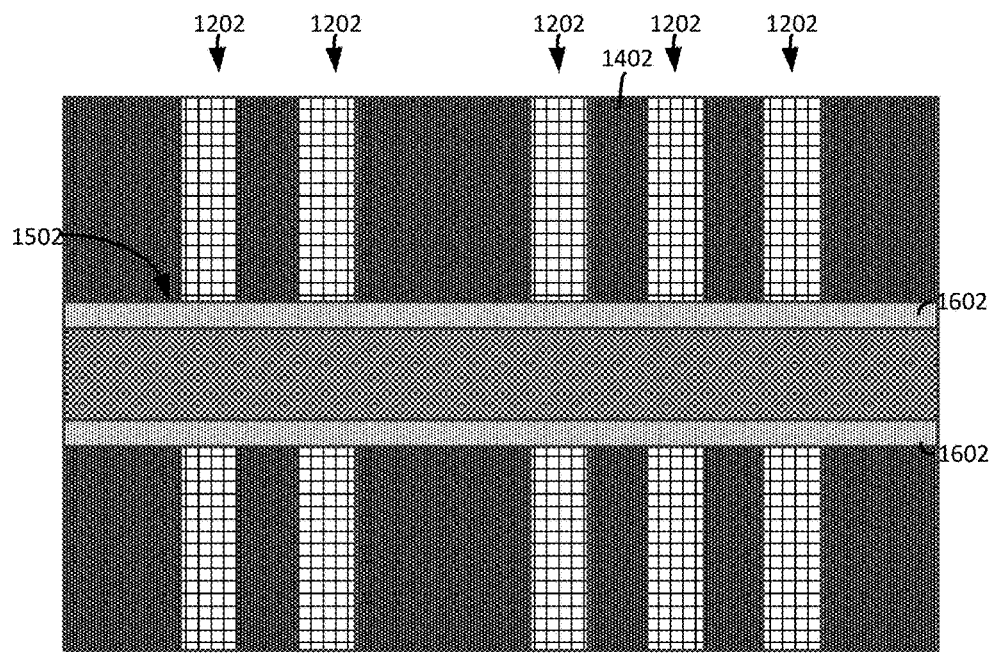
FIG. 16 illustrates a top view following the formation of spacers adjacent to sidewalls of the sacrificial gate.

FIG. 16 illustrates a top view following the formation of spacers 1602 adjacent to sidewalls of the sacrificial gate 1502. The spacers 1602 in the illustrated embodiment are formed by depositing a layer of spacer material (not shown) over the exposed portions of the insulator layer 1402, the fins 1002a, and the sacrificial gates 1502. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1602.

Figure 17A:
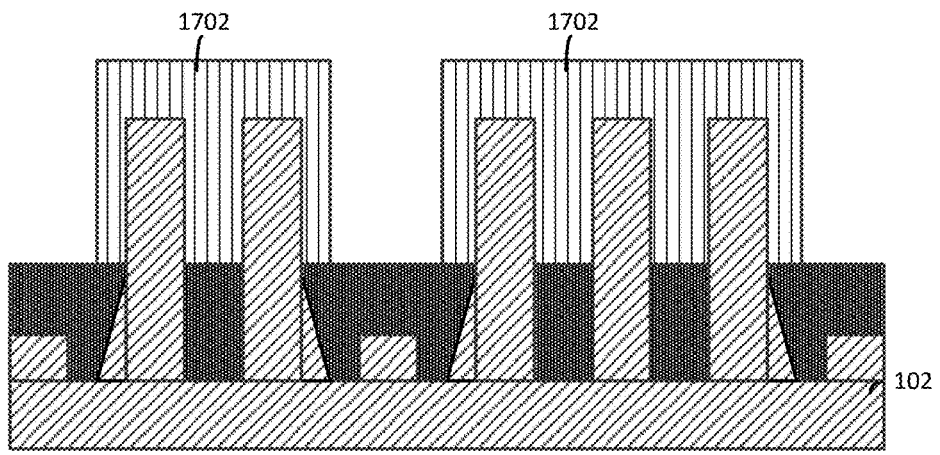
FIG. 17A illustrates a cut-away view along the line A-A (of FIG. 17B) following the formation of source/drain regions.
Figure 17B:
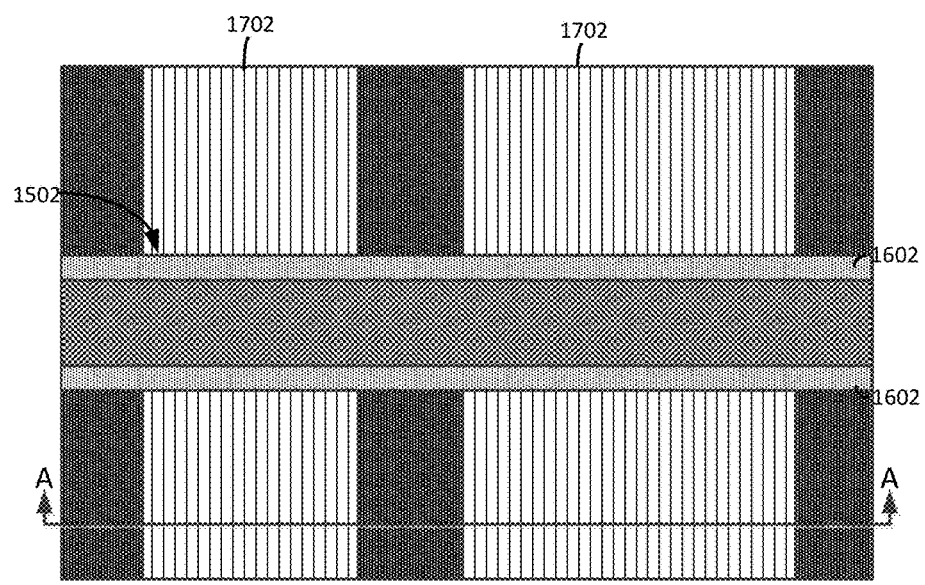
FIG. 17B illustrates a top view of the source/drain regions.

FIG. 17A illustrates a cut-away view along the line A-A (of FIG. 17B) following the formation of source/drain regions 1702. FIG. 17B illustrates a top view of the source/drain regions 1702. The source/drain regions 1702 are formed by an epitaxial growth process that deposits a crystalline overlayer of semiconductor material onto the exposed crystalline seed material of the exposed fin 1002a to form the source/drain regions 1702.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 18A:
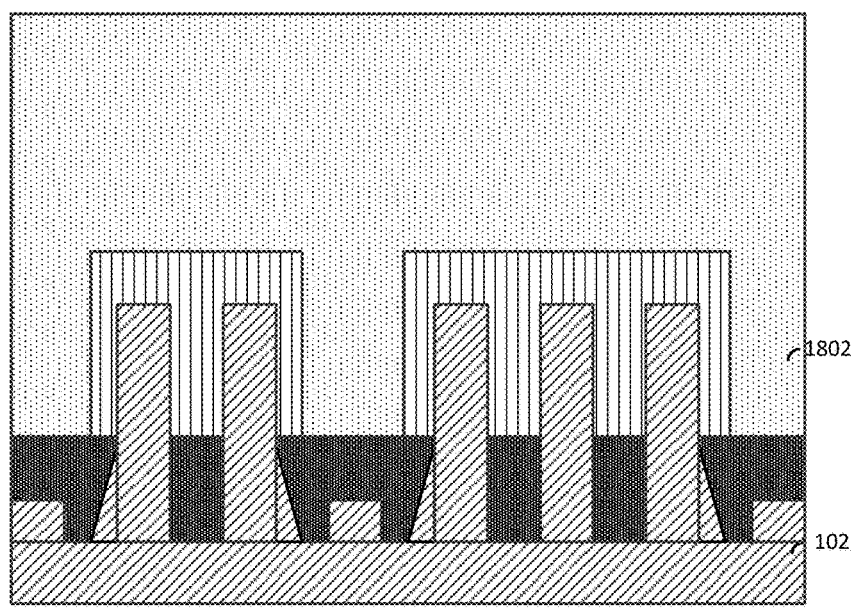
FIG. 18A illustrates a cut-away view along the line A-A (of FIG. 18B) following the deposition of an inter-level dielectric layer over portions of the source/drain regions.
Figure 18B:
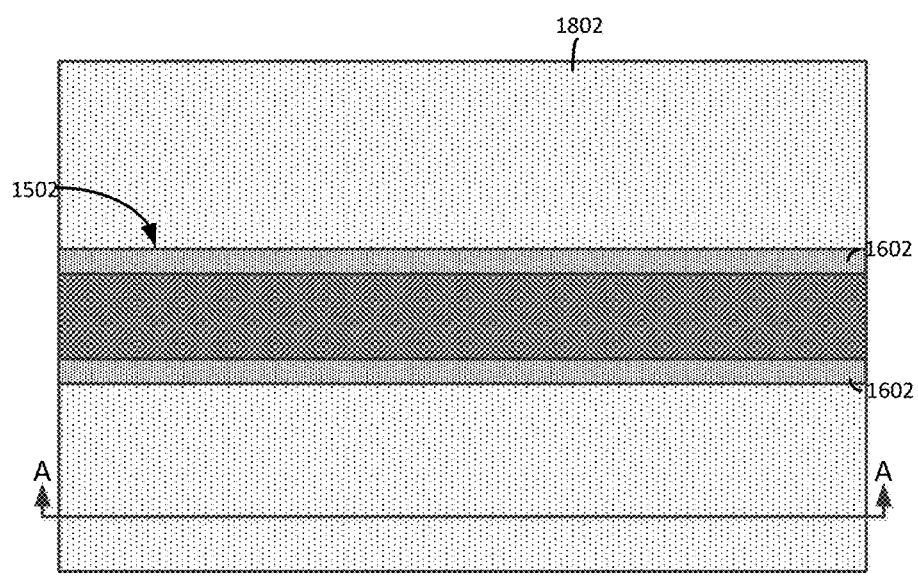
FIG. 18B illustrates a top view of the inter-level dielectric layer.

FIG. 18A illustrates a cut-away view along the line A-A (of FIG. 18B) following the deposition of an inter-level dielectric layer 1802 over portions of the source/drain regions 1702 and the insulator layer 1802. FIG. 18B illustrates a top view of the inter-level dielectric layer 1802.

The inter-level dielectric layer 1802 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1802 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1802, a planarization process such as, for example, chemical mechanical polishing is performed.

Figure 19:
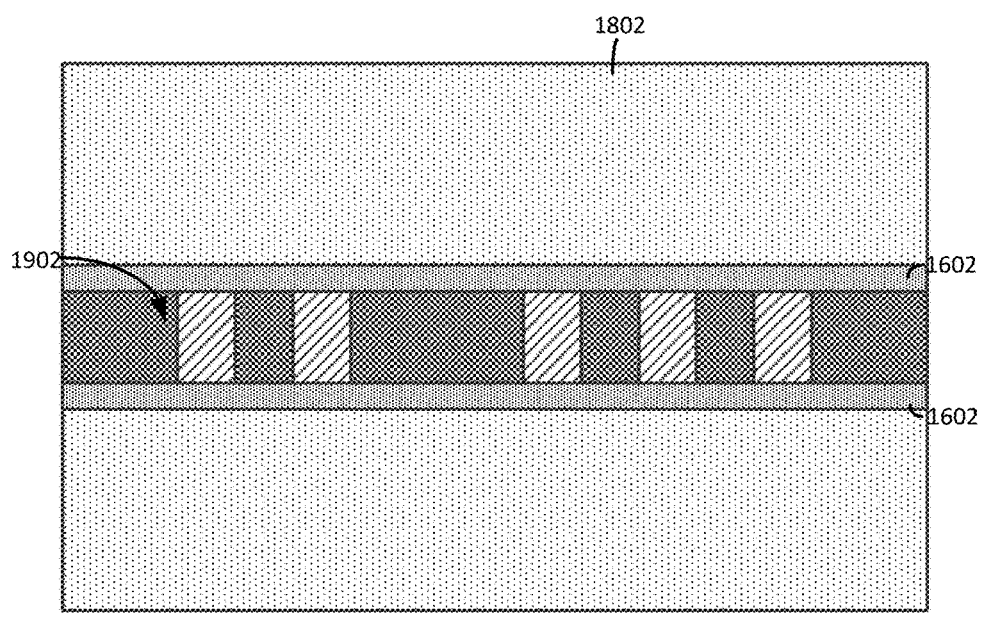
FIG. 19 illustrates a top view following the removal of the sacrificial gate (of FIG. 18B to form cavities that expose the channel regions of the fins.

FIG. 19 illustrates a top view following the removal of the sacrificial gate 1502 (of FIG. 18B to form cavities 1902 that expose the channel regions of the fins 1002a. The sacrificial gates 1502 may be removed by performing a dry etch process, for example, RIE, followed by a wet etch process. The wet etch process is selective to (will not substantially etch) the spacers 1602 and the inter-level dielectric material. The chemical etch process may include, but is not limited to, hot ammonia or tetramethylammonium hydroxide (TMAH).

Figure 20A:
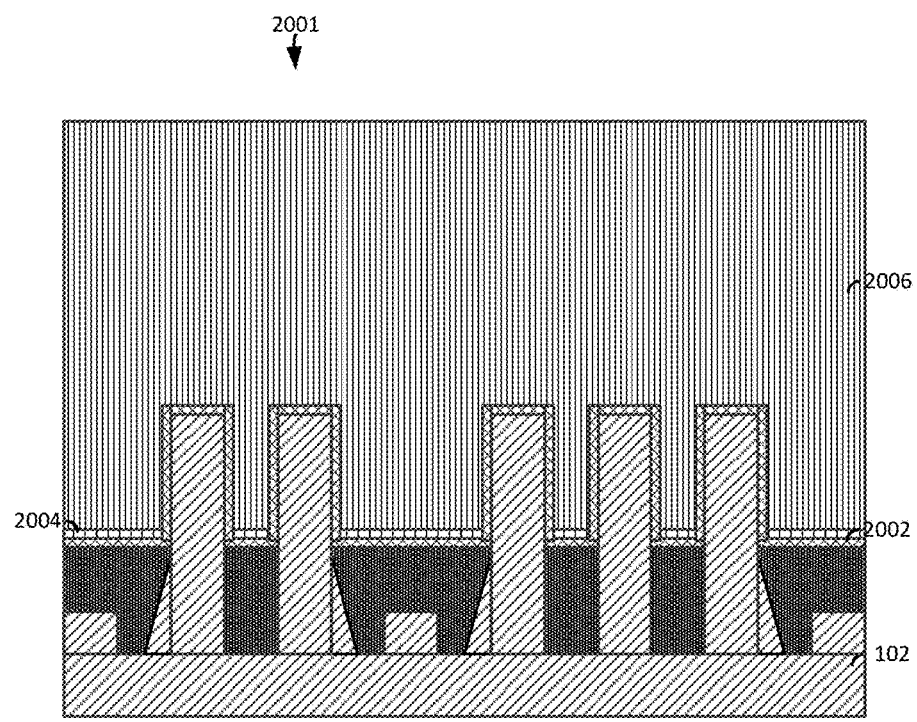
FIG. 20A illustrates a cut-away view along the line A-A (of FIG. 20B) following the formation of a replacement metal gate stack.
Figure 20B:
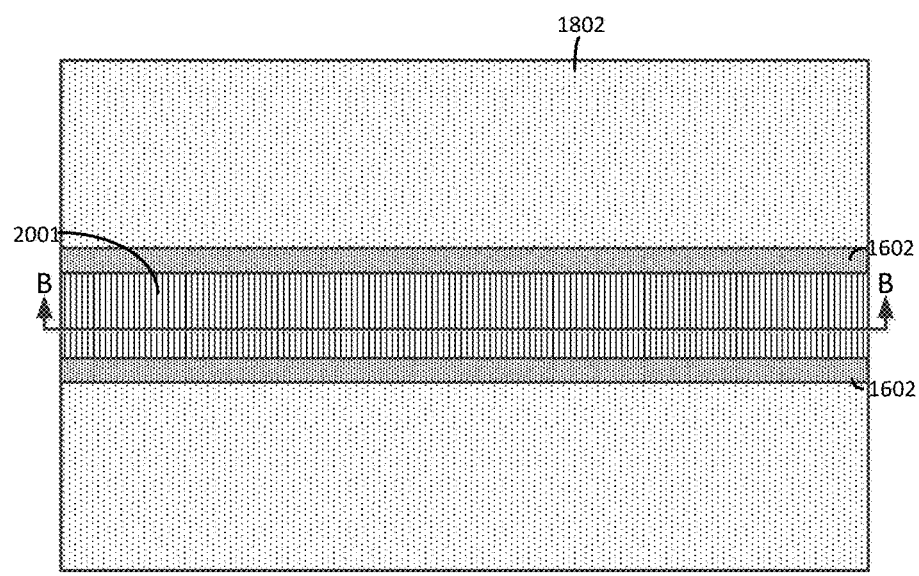
FIG. 20B illustrates a top view of the gate stack.

FIG. 20A illustrates a cut-away view along the line A-A (of FIG. 20B) following the formation of a replacement metal gate stack (gate stack) 2001. FIG. 20B illustrates a top view of the gate stack 2001. The gate stack 2001 includes high-k metal gates formed, for example, by filling the cavity 1902 (of FIG. 19) with one or more gate dielectric 2002 materials, one or more workfunction metals 2004, and one or more metal gate conductor 2006 materials. The gate dielectric 2002 material(s) can be a dielectric material having a dielectric constant greater than 3.9, 7.0, or 10.0.

Non-limiting examples of suitable materials for the dielectric 2002 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 2002 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 2004 may be disposed over the gate dielectric 2002 material. The type of work function metal(s) 2004 depends on the type of transistor and may differ between the nFET and pFET devices. Non-limiting examples of suitable work function metals 2004 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 2006 material(s) is deposited over the gate dielectric 2002 materials and work function metal(s) 2004 to form the gate stack 2001. Non-limiting examples of suitable conductive metals include aluminum (Al), platinum (Pt), gold (Au), tungsten (W), titanium (Ti), or any combination thereof. The gate conductor 2006 material(s) may be deposited by a suitable deposition process, for example, CVD, PECVD, PVD, plating, thermal or e-beam evaporation, and sputtering.

Following the deposition of the gate dielectric 2002 materials, the work function metal(s) 2004, and the gate conductor 2006 material(s), planarization process, for example, chemical mechanical planarization (CMP), is performed to remove the overburden of the deposited gate materials and form the gate stack 2001.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
    forming a first hardmask on a semiconductor substrate;
    forming a planarizing layer on the first hardmask;
    forming a second hardmask on the planarizing layer;
    removing portions of the second hardmask;
    forming alternating vertical blocks of a first material and a second material over the second hardmask;
    removing the vertical blocks of the second material to expose portions of the planarizing layer;
    removing exposed portions of the planarizing layer to expose portions of the first hardmask and removing portions of the first hardmask to expose portions of the semiconductor substrate;
    removing exposed portions of the semiconductor substrate to form a first fin and a second fin, wherein the first fin is arranged under a portion of the planarizing layer;
    further removing exposed portions of the semiconductor substrate to further increase the height of the first fin and substantially remove the second fin;
    forming a gate stack over a channel region of the first fin; and
    depositing a layer of the first material over portions of a first layer of the second hardmask prior to forming the alternating vertical blocks of the first material and the second material.

2. The method of claim 1, wherein the second hardmask includes a first layer arranged on the planarizing layer, a second layer arranged on the first layer, and a third layer arranged on the second layer.

3. The method of claim 2, wherein the first layer of the second hardmask includes a nitride material.

4. The method of claim 2, wherein the second layer of the second hardmask includes an oxide material.

5. The method of claim 2, wherein the third layer of the second hardmask includes a polymer material.

6. The method of claim 1, wherein the first hardmask is a nitride material.

7. The method of claim 1, wherein the planarizing layer includes an organic planarizing material.

8. The method of claim 1, wherein the first material includes a polystyrene material.

9. The method of claim 1, wherein the second material includes a poly(methyl methacrylate) (PMMA) material.

10. The method of claim 1, wherein the second hardmask comprises more than one layer.

11. The method of claim 1, wherein the second hardmask comprises a stack of layers.

12. The method of claim 1, wherein the second hardmask comprises a stack of at least two different layers.

13. The method of claim 1, wherein the second hardmask comprises a stack of three layers.

14. The method of claim 13, wherein the three layers are different materials.

15. The method of claim 1, wherein the substrate comprises silicon.

16. A method for fabricating a semiconductor device, the method comprising:
   forming a first hardmask on a semiconductor substrate;
   forming a planarizing layer on the first hardmask;
   forming a second hardmask on the planarizing layer;
   removing portions of the second hardmask;
   forming alternating vertical blocks of a first material and a second material over the second hardmask;
   removing the vertical blocks of the second material to expose portions of the planarizing layer;
   removing exposed portions of the planarizing layer to expose portions of the first hardmask and removing portions of the first hardmask to expose portions of the semiconductor substrate;
   removing exposed portions of the semiconductor substrate to form a first fin and a second fin, wherein the first fin is arranged under a portion of the planarizing layer;
   further removing exposed portions of the semiconductor substrate to further increase the height of the first fin and substantially remove the second fin; and
   forming a gate stack over a channel region of the first fin;
   wherein at least a part of the first fin has a sloped profile.

17. The method of claim 16, wherein the sloped profile is formed in proximity to the second fin.

* * * * *